(12) United States Patent
    An

(10) Patent No.: US 11,049,883 B2
(45) Date of Patent: Jun. 29, 2021

(54) COA TYPE ARRAY SUBSTRATE AND METHOD FOR MEASURING VIA SIZE ON COLOR-RESIST LAYER

(71) Applicant: Shenzhen China Star Optoelectronics Technology Co., Ltd., Shenzhen (CN)

(72) Inventor: Liyang An, Shenzhen (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 402 days.

(21) Appl. No.: 16/099,181

(22) PCT Filed: Sep. 14, 2018

(86) PCT No.: PCT/CN2018/105630
    § 371 (c)(1),
    (2) Date: Nov. 5, 2018

(87) PCT Pub. No.: WO2019/218554
    PCT Pub. Date: Nov. 21, 2019

(65) Prior Publication Data
    US 2021/0096432 A1    Apr. 1, 2021

(30) Foreign Application Priority Data
    May 16, 2018 (CN) .......................... 201810469942.2

(51) Int. Cl.
    *H01L 27/12*    (2006.01)
    *G02F 1/1362*   (2006.01)
    *G02F 1/1368*   (2006.01)
    *H01L 21/66*    (2006.01)

(52) U.S. Cl.
    CPC .......... *H01L 27/124* (2013.01); *G02F 1/1368* (2013.01); *G02F 1/136222* (2021.01); *G02F 1/136227* (2013.01); *H01L 22/12* (2013.01); *H01L 27/1248* (2013.01); *H01L 27/1255* (2013.01)

(58) Field of Classification Search
    CPC ............. G02F 1/136227; G02F 1/1368; H01L 27/124; H01L 27/1248; H01L 27/1255; H01L 22/12
    See application file for complete search history.

(56) References Cited

U.S. PATENT DOCUMENTS

| 2002/0021378 A1* | 2/2002 | Murade ............. G02F 1/136227 349/43 |
| 2003/0090601 A1* | 5/2003 | Kim ...................... G02F 1/1368 349/43 |
| 2003/0213966 A1* | 11/2003 | Yang ...................... H01L 27/12 257/93 |

* cited by examiner

Primary Examiner — Feifei Yeung Lopez
(74) Attorney, Agent, or Firm — Leong C. Lei

(57) ABSTRACT

The invention provides a COA type array substrate and a method for measuring via size on color-resist layer. The COA type array substrate is formed by designing a drain of the TFT comprising a drain body corresponding to a first via of the color-resist layer, and a first extending portion, a second extending portion and a third extending portion formed by outwardly protruding from edge of the drain body, able to improve the measurement accuracy of the size of the first via on the color-resist layer, thereby improving the production yield of the COA type array substrate.

9 Claims, 4 Drawing Sheets

COA TYPE ARRAY SUBSTRATE AND METHOD FOR MEASURING VIA SIZE ON COLOR-RESIST LAYER

BACKGROUND OF THE INVENTION

1. Field of the Invention

The present invention relates to the field of display, and in particular to a color-filter on array (COA) type array substrate and a method for measuring via size on color-resistor layer.

2. The Related Arts

Liquid crystal display (LCD) provides many advantages, such as, thinness, power saving, and no radiation, and has been widely used, such as, LCD TV, mobile phone, personal digital assistant (PDA), digital camera, computer screen or laptop screen.

The structure of a liquid crystal (LC) panel comprises a color filter (CF) substrate, a thin film transistor (TFT) array substrate, and a liquid crystal layer disposed between the two substrates.

The color-filter on array (COA) technology is an integration technology for directly forming a color-resist layer of a CF substrate on an array substrate. The array substrate is called a COA type array substrate, and the COA technology can effectively solve the light leakage problem of LCD device caused by the misalignment in the box process, as well as significantly increase the display aperture ratio and improve the display quality of the panel. In the COA type array substrate, the drain and the pixel electrode must be conductively connected through the via on the passivation layer and the via hole on the color-resist layer. The via on the color-resist layer is generally referred to as CF open by the industry. FIG. 1 is a schematic view showing a pixel design of a conventional COA type array substrate. As shown in FIG. 1, a first via 610 is disposed in the color-resist layer, a drain 520 is located under the first via 610, and a storage electrode 220 is located under the drain 520, wherein the drain 520 comprises a drain body 504 located in the first via 610 and an extension 505 connected to the drain body 504 and extending toward a source 510, the storage electrode 220 has most or all of the boundaries located around the first via 610.

The size of the first via 610 (CF open) is a key process parameter of the color-resist layer, which directly affects the amount of liquid crystal used in the subsequent process and the risk of bubbles, so that each batch of products in the actual production must be monitored on the first via 610 for size. For batches with the oversized first via 610, the relevant parameters must be adjusted and corrected in time to ensure product quality.

In the exposure and development process of the color-resist layer, the pattern of the mask corresponding to the first via 610 is square or rectangular, but in actual production. However, in actual production, due to the characteristics of the exposure and development process, the pattern of the obtained first via 610 is usually an approximate standard circle or ellipse. In actual production, the critical dimension (CD) of the first via 610 is usually measured to improve the accuracy of subsequent processes, as shown in FIG. 2. The conventional measurement method for the first via 610 (CF open) is: after forming the first via 610 on the color-resist layer, the first via 610 is photographed, and then the photo is analyzed by computer software; three points A, B, and C on the boundary of the first via 610 are captured, and the size of the first via 610 is calculated according to the principle of three-point co-circle; however, as shown in FIG. 3, when the edge of a metal layer exists in the first via 610, the edge of the metal layer may interfere with the boundary point capture of the first via 610, resulting in a mistake in the captured point, thereby failing to ensure the accuracy of the measurement. When the measurement of the first via 610 is inaccurate, the production efficiency of the product is easily affected, and results in untimely process variation, and leading to losses to the enterprise.

The metal layer under the first via 610 in the COA type array substrate comprises a drain 520 and a storage electrode 220. Since most or all of the boundaries of the storage electrode 220 are located at the periphery of the boundary of the first via 610, the storage electrode 220 does not substantially interfere with the boundary point capturing of the first via 610; however, the area of the drain 520 is small, and most of the boundaries are located inside the first via 610, so the boundary point capturing of the first via 610 I easily interfered. A conventional solution is to increase the area of the drain 520 until the drain 520 covers the first via 610 to ensure that there is no boundary of the drain 520 inside the first via 610, thereby avoiding the edge of the drain 520 interfering with the boundary point capturing of the first via 610. However, since the storage capacitance (Cst) is formed between the drain 520 and the storage electrode 220, for the already-designed pixel, Cst usually has an optimal value, and the area of the drain 520 cannot be increased without limitation. As such, the method of increasing the area of the drain 520 is not used in actual production to solve the boundary point capturing interference problem of the first via 610.

SUMMARY OF THE INVENTION

The object of the present invention is to provide a COA type array substrate able to improve the measurement accuracy of the size of the first via on the color-resist layer and further improve the production yield of the COA type array substrate.

Another object of the present invention is to provide a method for measuring the via size on the color-resist layer, able to avoid the occurrence of point capturing error in the measurement process of the first via, improve the measurement accuracy, and thus improve the production yield.

To achieve the above object, the present invention provides a COA type array substrate, which comprises: a thin film transistor (TFT) and a color-resist layer disposed on the TFT;

a first via disposed on the color-resist layer for electrically connecting a drain of the TFT and a pixel electrode;

the drain of the TFT comprising a drain body disposed corresponding to the first via, and a first extending portion, a second extending portion, and a third extending portion formed by outwardly protruding from edges of the drain body.

The first extending portion, the second extending portion and the third extending portion all intersect with boundary of the first via.

The shape of the first via is circular or elliptical.

The TFT comprises: a first base substrate; a first metal layer disposed on the first base substrate; an insulating layer disposed on the first metal layer and the first base substrate, an active layer disposed on the insulating layer, and a second metal layer disposed on the active layer and the insulating layer; the second metal layer comprises a source and a drain spaced apart and respectively contacting both ends of the active layer, and the color-resist layer is located above the second metal layer, the active layer and the insulating layer.

The COA type array substrate further comprises a passivation layer disposed on the color-resist layer; a pixel electrode is disposed on the passivation layer; and the passivation layer is provided with a second via corresponding to the first via, and the pixel electrode contacts with the drain through the first via and the second via.

The first extending portion extends toward the source, and the first extending portion contacts with the active layer;

the first metal layer comprises a gate and a storage electrode, spaced apart; the drain is disposed above the storage electrode, and a storage capacitor is formed between the drain and the storage electrode.

The first extending portion and the second extending portion extend in opposite directions, the first extending portion and the second extending portion are located on a same straight line, and the third extending portion extends in a direction perpendicular to the directions of the first extending portion and the second extending portion.

The present invention also provides a method for measuring via size on color-resist layer, which comprises:

Step 1: providing the aforementioned COA type array substrate;

Step 2: selecting a first point, a second point, and a third point from intersections of the first extending portion, the second extending portion, and the third extending portion and the boundary of the first via, respectively, and calculating size of the first via according to three points co-circle principle.

The first point, the second point, and the third point selected in Step 2 are three vertices of an equilateral triangle, respectively.

The first point, the second point, and the third point selected in Step 2 are three vertices of the isosceles triangle, respectively.

The present invention provides the following advantages: the COA type array substrate of the present invention is configured by designing a drain of the TFT comprising a drain body corresponding to a first via of the color-resist layer, and a first extending portion, a second extending portion and a third extending portion formed by outwardly protruding from edge of the drain body, so as to improve the measurement accuracy of the size of the first via on the color-resist layer, thereby improving the production yield of the COA type array substrate. The method for measuring the via size on the color-resist layer of the present invention selects a point each from the intersections of the first, second and third extending portions and the boundary of the first via, respectively, and then calculates the via size according to the three-point co-circle principle to avoid the occurrence of point capturing errors in the first via size measurement process, improve the measurement accuracy, and thereby improve the production yield.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
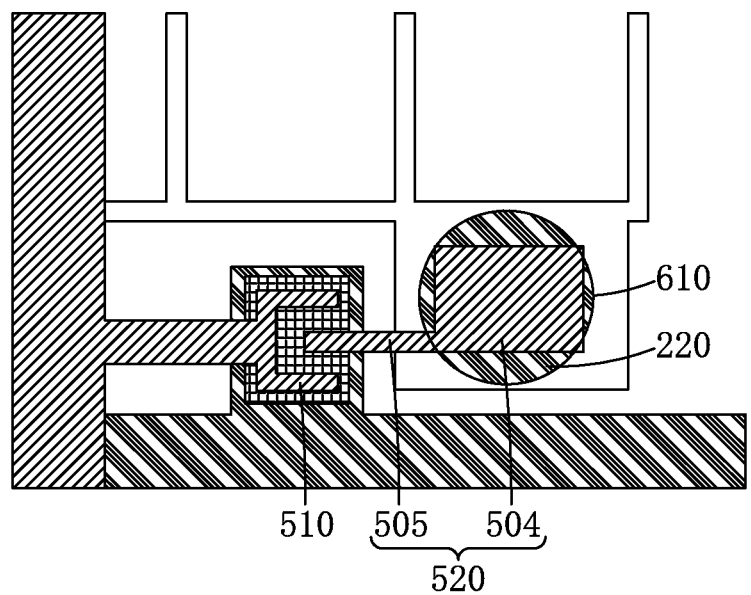
FIG. 1 is a schematic view showing the design of a conventional COA type array substrate.
Figure 2:
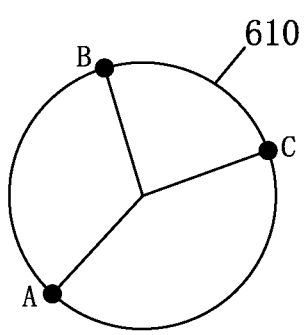
FIG. 2 is a schematic view showing the measurement of the first via size on color-resistor layer of an existing COA type array substrate by a three-point co-circle method.
Figure 3:
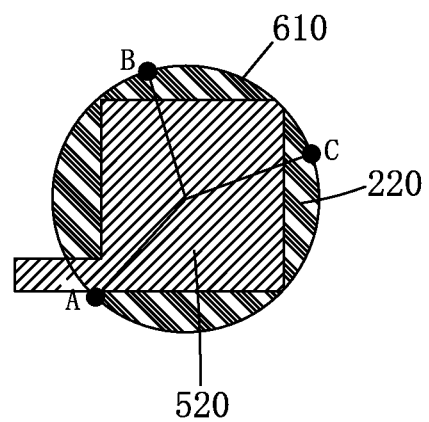
FIG. 3 is a schematic view showing interference caused by the drain edge of the conventional COA type array substrate to the size measurement of the first via on the color-resist layer.
Figure 4:
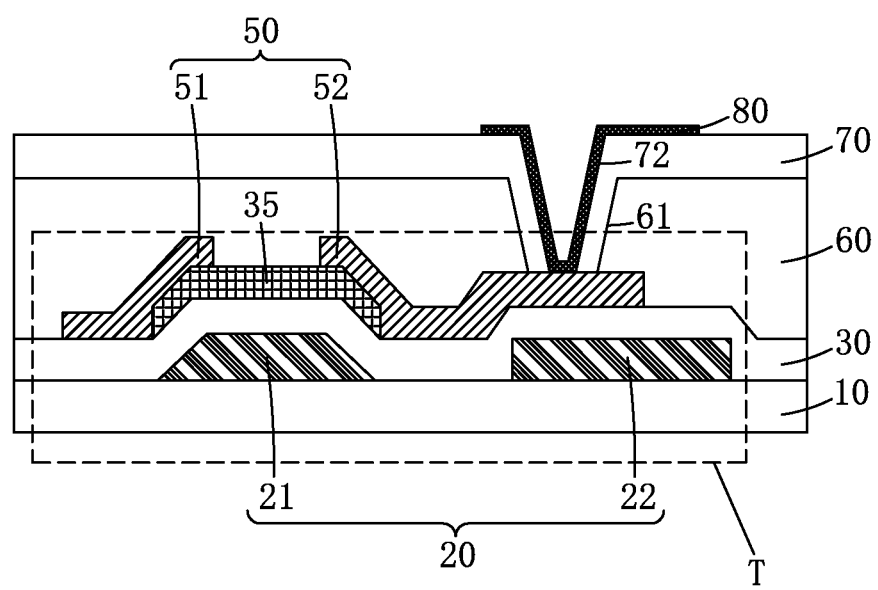
FIG. 4 is a cross-sectional view showing a COA type array substrate of the present invention.
Figure 5:
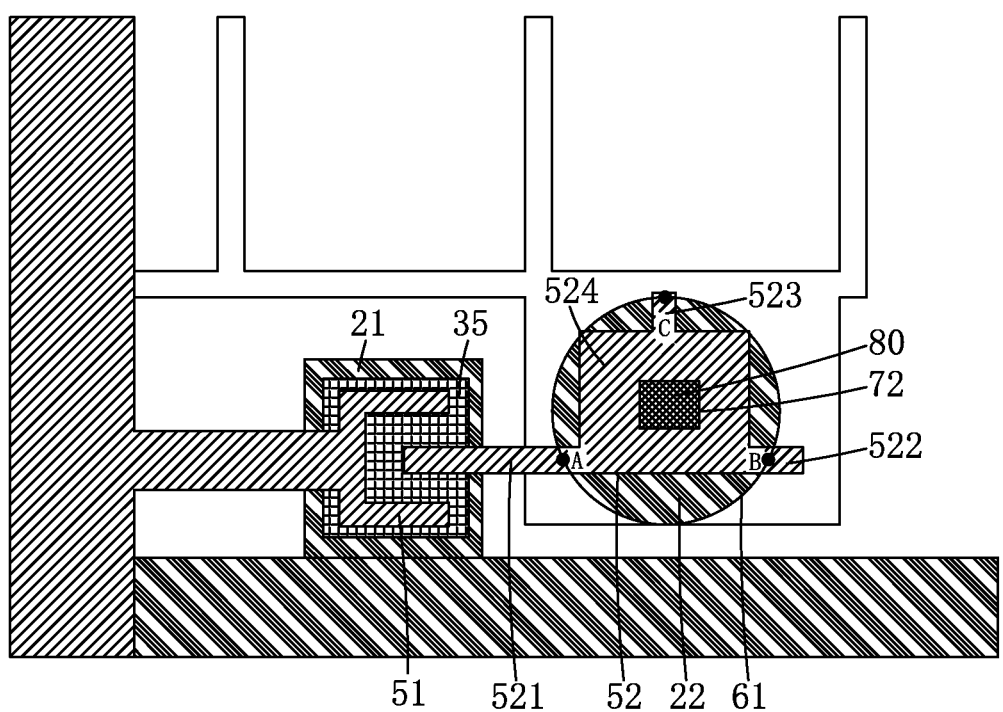
FIG. 5 is a top view showing a COA type array substrate of the present invention.

Refer to FIG. 4 and FIG. 5. The present invention provides a COA type array substrate, comprising: a thin film transistor (TFT) T and a color-resist layer 60 disposed on the TFT T;

a first via 61 disposed on the color-resist layer 60 for electrically connecting a drain 52 of the TFT T and a pixel electrode 80;

the drain 52 of the TFT T comprising a drain body 524 disposed corresponding to the first via 61, and a first extending portion 521, a second extending portion 522, and a third extending portion 523 formed by outwardly protruding from edge of the drain body 524.

Specifically, the TFT T may be a bottom-gate type TFT, a top-gate type TFT or a double-gate type TFT, and the present invention is described herein as a bottom-gate type TFT. The TFT T comprises a first base substrate 10, a first metal layer 20 disposed on the first base substrate 10, an insulating layer 30 disposed on the first metal layer 20 and the first base substrate 10, an active layer 35 disposed on the insulating layer 30, and a second metal layer 50 disposed on the active layer 35 and the insulating layer 30; the second metal layer 50 comprises a source 51 and a drain 52 spaced apart and respectively contacting both ends of the active layer 35, and the color-resist layer 60 is located above the second metal layer 50, the active layer 35 and the insulating layer 30.

Specifically, the first via 61 is obtained by exposing and developing the color-resist layer 60 with a mask, and the shape of the mask corresponding to the first via 61 is a square or a rectangle; when the shape for preparing the first via 61 is square, since the photoresist at the four corners of the square is difficult to be developed, the resulting first via 61 is substantially circular; when the shape for preparing the first via 61 is a rectangle, the photoresist at the four corners of the rectangle is difficult to be developed, and the resulting first via 61 is substantially elliptical. In actual production, in most cases, the first via 61 is circular.

Specifically, the first extending portion 521, the second extending portion 522 and the third extending portion 523 all intersect with boundary of the first via 61. Because the first extending portion 521, the second extending portion 522 and the third extending portion 523 all intersect with boundary of the first via 61, when performing measurement on the size of the first via 61, a first point A, a second point B, and a third point C may be respectively selected from intersections of the first extending portion 521, the second extending portion 522, and the third extending portion 523 with the boundary of the first via 61. The size of the first via 61 can be calculated according to the three-point co-circle principle, that is, the critical parameter of the circle or ellipse, such as the diameter of the circle or the length of the minor axis and the major axis of the ellipse.

Specifically, the first extending portion 521 extends toward the source 51, and the first extending portion 521 contacts with the active layer 35. In other words, the first extending portion 521 is an original structure in a conventional drain, and the second extending portion 522 and the third extending portion 523 are newly added structures to the conventional drain by the present invention.

Specifically, the first metal layer 20 comprises a gate 21 and a storage electrode 22, spaced apart; the drain 52 is disposed above the storage electrode 22, and a storage capacitor $C_{st}$ is formed between the drain 52 and the storage electrode 22. Most of the boundary or the entire boundary of the storage electrode 22 exceeds the boundary of the first via 61, so the storage electrode 22 does not substantially interfere with the boundary of the first via 61;

When a partial boundary of the storage electrode 22 is located in the first via 61 and the partial boundary interferes with the point capturing of the first via 61, it is necessary to dispose structure similar to the three extending portions of the drain 52 at the edge of the storage electrode 22, that is, extensions or protrusions connected to the storage electrode 22 and intersecting the boundary of the first via 61 to eliminate the edge of the storage electrode 22 from the interference on the point capturing of the first via 61 caused by the edge of the storage electrode 22.

Specifically, the active layer 35 is disposed correspondingly above the gate 21.

Specifically, the drain body 524 extends towards different directions to form the first extending portion 521, the second extending portion 522 and the third extending portion 523 respectively. The first extending portion 521 and the second extending portion 522 extend in opposite directions, the first extending portion 521 and the second extending portion 522 are located on a same straight line, and the third extending portion 53 extends in a direction perpendicular to the directions of the first extending portion 521 and the second extending portion 522.

Specifically, the COA type array substrate further comprises a passivation layer 70 disposed on the color-resist layer 60; the pixel electrode 80 is disposed on the passivation layer 70; and the passivation layer 70 is provided with a second via 72 corresponding to the first via 61, and the pixel electrode 80 contacts with the drain 52 through the first via 61 and the second via 72.

Specifically, the size of the second via 72 is smaller than the size of the first via 61.

Compared with the drain in the conventional COA type array substrate, the total area of the drain 52 in the COA type array substrate of the present invention remains substantially unchanged, thereby ensuring that the storage capacitance between the drain 52 and the storage electrode 22 is substantially maintained. The area of the drain body 524 in the present application is smaller than the area of the drain 52 in the conventional COA type array substrate.

The COA type array substrate can be configured to comprise the drain body 524 and the first extending portion 521, the second extending portion 522, and the third extending portion 523, which are spaced apart from one another and are connected to the drain body 524. It is thus ensured that the measurement accuracy of the size of the first via 61 on the color-resist layer 60 is high, and thus the production yield of the COA type array substrate is also high.

Figure 6:
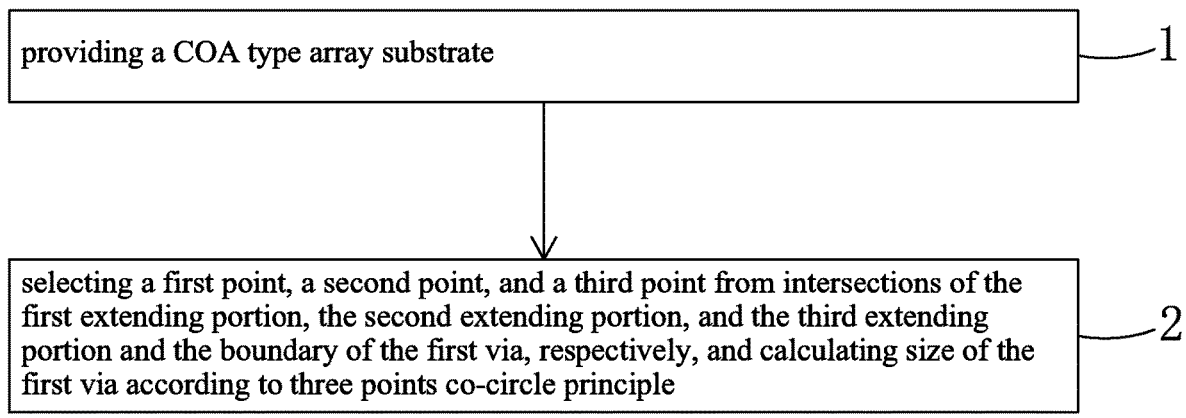
FIG. 6 is a flowchart showing the method for measuring via size on color-resist layer of the present invention.

Refer to FIG. 6. Based on the aforementioned COA type array substrate, the present invention also provides a method for measuring via size on color-resist layer, which comprises:

Step 1: providing the aforementioned COA type array substrate;

Step 2: selecting a first point A, a second point B, and a third point C from intersections of the first extending portion 521, the second extending portion 522, and the third extending portion 523 and the boundary of the first via 61, respectively, and calculating size of the first via 61 according to three points co-circle principle. By measuring the size of the first via 61, it is advantageous to improve the accuracy of the subsequent process and improve the production yield of the COA type array substrate.

Specifically, in Step 2, the first via 61 is first photographed, and then the photo is analyzed by computer software, by selecting a first point A, a second point B, and a third point C from intersections of the first extending portion 521, the second extending portion 522, and the third extending portion 523 and the boundary of the first via 61, respectively, and calculating size of the first via 61 according to three points co-circle principle.

Specifically, when the first via 61 is circular, preferably, the first point A, the second point B, and the third point C selected in Step 2 are three vertices of an equilateral triangle, respectively. That is, an equilateral triangle is inscribed in the first via 61, thereby facilitating accurate measurement of the diameter of the first via 61. When the first via 61 is elliptical, preferably, the first point A, the second point B, and the third point C selected in Step 2 are three vertices of an isosceles triangle, respectively. That is, an isosceles triangle is inscribed in the first via 61 to facilitate accurate measurement of the diameter of the first via 61.

The method for measuring the via size on the color-resist layer is performed by selecting a first point A, a second point B, and a third point C from intersections of the first extending portion 521, the second extending portion 522, and the third extending portion 523 and the boundary of the first via 61, respectively, and calculating size of the first via 61 according to three points co-circle principle so as to avoid occurrence of point capturing error during the dimension measurement of the first via 61. The situation improves the measurement accuracy and thus the production yield.

In summary, the COA type array substrate of the present invention is configured by designing a drain of the TFT comprising a drain body corresponding to a first via of the color-resist layer, and a first extending portion, a second extending portion and a third extending portion formed by outwardly protruding from edge of the drain body, so as to improve the measurement accuracy of the size of the first via on the color-resist layer, thereby improving the production yield of the COA type array substrate. The method for measuring the via size on the color-resist layer of the present invention selects a point each from the intersections of the first, second and third extending portions and the boundary of the first via, respectively, and then calculates the via size according to the three-point co-circle principle to avoid the occurrence of point capturing errors in the first via size measurement process, improve the measurement accuracy, and thereby improve the production yield.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A color-filter on array (COA) type array substrate, comprising: a thin film transistor (TFT) and a color-resist layer disposed on the TFT;
   a first via disposed on the color-resist layer for electrically connecting a drain of the TFT and a pixel electrode;
   the drain of the TFT comprising a drain body disposed corresponding to the first via, and a first extending portion, a second extending portion, and a third extending portion formed by outwardly protruding from edges of the drain body;
   wherein the first extending portion, the second extending portion and the third extending portion all intersect with boundary of the first via.

2. The COA type array substrate as claimed in claim 1, wherein shape of the first via is circular or elliptical.

3. The COA type array substrate as claimed in claim 1, wherein the TFT comprises: a first base substrate; a first metal layer disposed on the first base substrate; an insulating layer disposed on the first metal layer and the first base substrate, an active layer disposed on the insulating layer, and a second metal layer disposed on the active layer and the insulating layer; the second metal layer comprises a source and a drain spaced apart and respectively contacting both ends of the active layer, and the color-resist layer is located above the second metal layer, the active layer and the insulating layer.

4. The COA type array substrate as claimed in claim 1, further comprising: a passivation layer disposed on the color-resist layer; a pixel electrode being disposed on the passivation layer; and the passivation layer being provided with a second via corresponding to the first via, and the pixel electrode contacting with the drain through the first via and the second via.

5. The COA type array substrate as claimed in claim 3, wherein the first extending portion extends toward the source, and the first extending portion contacts with the active layer;
   the first metal layer comprises a gate and a storage electrode, spaced apart; the drain is disposed above the storage electrode, and a storage capacitor is formed between the drain and the storage electrode.

6. The COA type array substrate as claimed in claim 1, wherein the first extending portion and the second extending portion extend in opposite directions, the first extending portion and the second extending portion are located on a same straight line, and the third extending portion extends in a direction perpendicular to the directions of the first extending portion and the second extending portion.

7. A method for measuring via size on color-resist layer, comprising the following steps:
   Step 1: providing a COA type array substrate as claimed as in claim 1;
   Step 2: selecting a first point, a second point, and a third point from intersections of the first extending portion, the second extending portion, and the third extending portion and the boundary of the first via, respectively, and calculating size of the first via according to three points co-circle principle.

8. The method for measuring via size on color-resist layer as claimed in claim 1, wherein the first point, the second point, and the third point selected in Step 2 are three vertices of an equilateral triangle, respectively.

9. The method for measuring via size on color-resist layer as claimed in claim 7, wherein the first point, the second point, and the third point selected in Step 2 are three vertices of the isosceles triangle, respectively.

* * * * *